United States Patent
Rascuná et al.

(10) Patent No.: US 12,224,321 B2
(45) Date of Patent: *Feb. 11, 2025

(54) SCALABLE MPS DEVICE BASED ON SiC

(71) Applicant: STMICROELECTRONICS S.r.l., Agrate Brianza (IT)

(72) Inventors: Simone Rascuná, Catania (IT); Mario Giuseppe Saggio, Aci Bonaccorsi (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 18/532,975

(22) Filed: Dec. 7, 2023

(65) Prior Publication Data

US 2024/0178280 A1 May 30, 2024

Related U.S. Application Data

(63) Continuation of application No. 17/374,871, filed on Jul. 13, 2021, now Pat. No. 11,869,944.

(30) Foreign Application Priority Data

Jul. 27, 2020 (IT) .................. 102020000018127

(51) Int. Cl.
*H01L 29/16* (2006.01)
*H01L 29/66* (2006.01)
*H01L 29/872* (2006.01)

(52) U.S. Cl.
CPC .... *H01L 29/1608* (2013.01); *H01L 29/66136* (2013.01); *H01L 29/66143* (2013.01); *H01L 29/872* (2013.01)

(58) Field of Classification Search
CPC .......... H01L 29/1608; H01L 29/66136; H01L 29/66143; H01L 29/872
USPC ......................................................... 257/471
See application file for complete search history.

(56) References Cited

U.S. PATENT DOCUMENTS

| | | | |
|---|---|---|---|
| 8,716,788 B2 | 5/2014 | Weber et al. | |
| 8,866,151 B2 | 10/2014 | Noda et al. | |
| 11,869,944 B2 * | 1/2024 | Rascuná | ................. H01L 29/45 |
| 2014/0327019 A1 | 11/2014 | Kinoshita et al. | |

(Continued)

FOREIGN PATENT DOCUMENTS

JP 2011142355 A 7/2011

*Primary Examiner* — Monica D Harrison
(74) *Attorney, Agent, or Firm* — Seed IP Group LLP (57) ABSTRACT

Merged-PiN-Schottky, MPS, device comprising: a substrate of SiC with a first conductivity; a drift layer of SiC with the first conductivity, on the substrate; an implanted region with a second conductivity, extending at a top surface of the drift layer to form a junction-barrier, JB, diode with the substrate; and a first electrical terminal in ohmic contact with the implanted region and in direct contact with the top surface to form a Schottky diode with the drift layer. The JB diode and the Schottky diode are alternated to each other along an axis: the JB diode has a minimum width parallel to the axis with a first value, and the Schottky diode has a maximum width parallel to the axis with a second value smaller than, or equal to, the first value. A breakdown voltage of the MPS device is greater than, or equal to, 115% of a maximum working voltage of the MPS device in an inhibition state.

18 Claims, 5 Drawing Sheets

(56) References Cited

U.S. PATENT DOCUMENTS

2015/0372093 A1  12/2015  Saggio et al.
2018/0190651 A1   7/2018  Siemieniec et al.
2018/0308992 A1  10/2018  Uchida

* cited by examiner

SCALABLE MPS DEVICE BASED ON SiC

BACKGROUND

Technical Field

The present disclosure relates to a scalable electronic device based on silicon carbide, an electronic device manufacturing method and an electronic apparatus comprising the electronic device. In particular, the present disclosure relates to a miniaturizable merged-PiN-Schottky device with reduced current leakages.

Description of the Related Art

As is known, semiconductor materials, which have a wide band gap (e.g., which have an energy value Eg of the band gap greater than 1.1 eV), low on-state resistance (RON), high thermal conductivity, high operating frequency and high charge carrier saturation velocity, are ideal for producing electronic components, such as diodes or transistors, in particular for power applications. A material having said features, and designed to be used for manufacturing electronic components, is silicon carbide (SIC). In particular, silicon carbide, in its different polytypes (e.g., 3C—SiC, 4H—SiC, 6H—SiC), is preferable to silicon as regards the properties listed previously.

Electronic devices provided on a silicon-carbide substrate, with respect to similar devices provided on a silicon substrate, have numerous advantages, such as low on-state output resistance, low leakage current, high working temperature, and high working frequencies. In particular, SiC Schottky diodes have demonstrated higher switching performance, making SiC electronic devices especially favorable for high frequency applications.

Merged-PiN-Schottky (MPS) devices based on SiC are also known. The MPS device has at least one Schottky diode and at least one PN diode (i.e., junction and semiconductors) arranged so to be in parallel to each other.

During use in the forward state, due to a lower Schottky diode forward voltage (approximately 0.7 V) with respect to the PN diode forward voltage (approximately 2.5 V), the MPS device operates as a Schottky diode with lower current density (low leakages in on-state, for applied voltages comprised between approximately 0.7 V and approximately 3 V) and assumes the feature of a PN diode, with sufficiently higher current density (e.g., for applied voltages greater than 3 V). In this manner, the MPS device has the high switching speed and the high efficiency typical of Schottky diodes but is also capable of operating at high voltages and currents such as PN diodes (e.g., reaches currents equal to approximately 100 A when biased to approximately 7 V).

In order for the MPS device to work efficiently in the on-state, known MPS devices are designed such that the Schottky diodes have a total junction area greater than a total junction area of the PN diodes. This criterion on the junction areas is also met during the MPS device miniaturization, necessary to optimize the current concentration, the electrical performance and the integration in electronic apparatuses.

However, there are technological limits, due to the lithographic processes currently used in the MPS device manufacturing, thereby arbitrarily decreasing the junction area of the PN diodes is not possible. In particular, an excessive scaling of the MPS device would cause a high risk of short circuit between ohmic contacts of the PN diodes and the Schottky diodes, which would cause damage to the MPS device.

As a result, in the design of known MPS devices there is a tradeoff between the achievable miniaturization and the electrical performance to be obtained.

BRIEF SUMMARY

The present disclosure is directed to providing a scalable MPS device based on SiC, an MPS device manufacturing method and an electronic apparatus comprising the MPS device, such as to overcome the drawbacks of the prior art.

The present disclosure is directed to a MPS device that includes a substrate of silicon carbide having a first conductivity, a drift layer of silicon carbide having the first conductivity, extending on the substrate, a first implanted region having a second conductivity opposite to the first conductivity and extending in the drift layer, the first implanted region having a first dimension in a first direction, and a second implanted region having the second conductivity and extending in the drift layer, the second implanted region having a second dimension in the first direction, the second implanted region being spaced from the first implanted region by a third dimension in the first direction, the third dimension being less than the second dimension. The MPS device includes a first ohmic contact in the first implanted region, the first ohmic contact having a fourth dimension in the first direction, the fourth dimension being less than the first dimension and a second ohmic contact in the second implanted region, the second ohmic contact having a fifth dimension in the first direction, the fifth dimension being less than the second dimension. The MPS device also includes a first junction-barrier (JB) diode at a first surface of the drift layer and the first implanted region and a second junction-barrier (JB) diode at the first surface of the drift layer and the second implanted region. A first electrical terminal is in ohmic contact with the first surface of the drift layer at the first implanted region and the second implanted region, the first electrical terminal having a fifth dimension in the first direction that is greater than a sum of the first, second, and third dimensions. A first Schottky diode at the drift layer between the first and second implanted regions, wherein the drift layer has a dopant concentration such that a breakdown voltage of the MPS device, beyond which a charge carrier multiplication phenomenon occurs, is greater than, or equal to, 115% of a maximum working voltage of the MPS device in an inhibition state.

The present disclosure is also directed to a device that includes a substrate of a first conductivity type, a drift layer of the first conductivity type, the drift layer having a first surface, a first implanted region of a second conductivity type extending into the drift layer from the first surface, the first implanted region having a first dimension in a first direction, and a second implanted region of the second conductivity type extending into the drift layer from the first surface, the second implanted region having a second dimension in the first direction, the second implanted region being spaced from the first implanted region by a third dimension in the first direction, the third dimension being less than the second dimension, the third dimension being less than the first dimension.

A first terminal is on the first surface of the drift layer, the first terminal being on the first and second implanted regions, the first terminal having a fourth dimension in the first direction, the fourth dimension being greater than a sum of the first, second, and third dimensions. A first Schottky diode is between the first terminal and the drift layer between the first and second implanted regions. A first junction barrier diode is between the first implanted region and the first terminal and a second junction barrier diode between the second implanted region and the first terminal.

BRIEF DESCRIPTION OF THE SEVERAL VIEWS OF THE DRAWINGS

For a better understanding of the present disclosure, preferred embodiments thereof are now described, purely by way of non-limiting example, with reference to the accompanying drawings, wherein.

Elements common to the different embodiments of the present disclosure, described herein below, are indicated with the same reference numbers.

DETAILED DESCRIPTION

Figure 1:
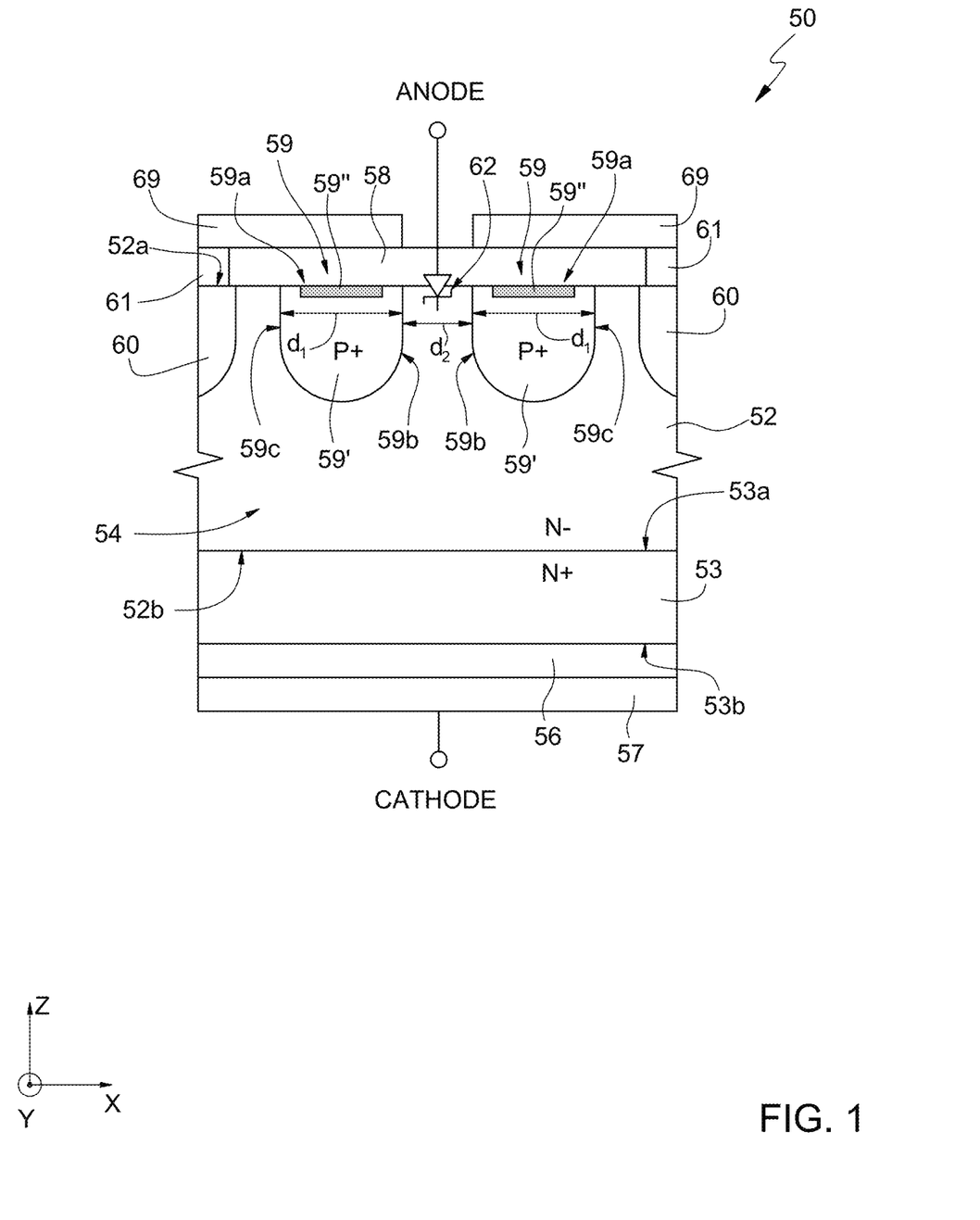
FIG. 1 shows, in cross-sectional view, an MPS device according to an embodiment of the present disclosure.

FIG. 1 shows, in lateral-sectional view in a Cartesian (tri-axial) reference system of axes X, Y, Z, a Merged-PiN-Schottky (MPS) device 50 according to an aspect of the present disclosure. In particular, the MPS device 50 is shown in FIG. 1 in an XZ-plane defined by axes X and Y, and is comprised in an electronic apparatus (not shown, such as notebook, mobile phone, server, TV, automobile, automobile charging station or conversion system for photovoltaic panels).

The MPS device 50 includes: a substrate 53, of N-type SiC, having a first dopant concentration, provided with a surface 53a opposite to a surface 53b, and thickness between the surfaces 53a and 53b comprised between 50 μm and 350 μm, more in particular between 160 μm and 200 μm, for example equal to 180 μm; a drift layer (grown in an epitaxial manner) 52, of N-type SiC, having a second dopant concentration smaller than the first dopant concentration and having a top surface 52a and a bottom surface 52b opposite to each other, the drift layer 52 extending on the surface 53a of the substrate 53 (in detail, the surfaces 53a and 52b are in contact to each other) and having a thickness between the surfaces 52a and 53b comprised between 5 and 15 μm; an ohmic contact region, or layer, 56 (e.g., of nickel silicide), extending on the surface 53b of the substrate 53; a cathode metallization 57, e.g., of Ti/NiV/Ag or Ti/NiV/Au, extending on the ohmic contact region 56; an anode metallization 58, e.g., of Ti/AlSiCu or Ni/AlSiCu, extending on the top surface 52a of the drift layer 52; a passivation layer 69 extending on the anode metallization 58, to protect the latter; at least one implanted region 59' of P-type in the drift layer 52, facing the top surface 52a of the drift layer 52 and, for each implanted region 59', a respective ohmic contact 59" such that each implanted region 59' forms a respective junction-barrier (JB) element 59 with the substrate 53; an edge termination region, or protection ring, 60 (optional), in particular a P-type implanted region, completely surrounding the junction-barrier (JB) elements 59; and an insulating layer 61 (optional) extending on the top surface 52a of the drift layer 52 so as to completely surround the JB elements 59, is at least partially superimposed to the protection ring 60 and laterally delimits the anode metallization 58.

One or more Schottky diodes 62 are formed at the interface between the drift layer 52 and the anode metallization 58, laterally to the implanted regions 59'. In particular, Schottky (semiconductor-metal) junctions are formed by portions of the drift layer 52 in direct electrical contact with respective portions of the anode metallization 58.

In particular, FIG. 1 shows two implanted regions 59' which, with the substrate 53, form respective JB elements 59. In more detail, the JB elements 59 are P-i-N diodes formed by the implanted regions 59', by the drift layer 52 and by the substrate 53.

The region of the MPS device 50 including the JB elements 59 and the Schottky diodes 62 (i.e., the region contained within the protection ring 60) is an active area 54 of the MPS device 50.

Each ohmic contact 59" forms an electrical connection having an electrical resistivity value lower than the electrical resistivity value of the implanted region 59' which houses it. The ohmic contacts 59" are formed according to prior arts. For example, each ohmic contact 59" is formed by one or more carbon-rich layers, including for example graphite layers, or graphene multi-layers. Alternatively, as shown in FIG. 1, the ohmic contacts 59" do not extend, along the Z-axis, beyond the top surface 52a; in other words, the ohmic contacts 59" have respective surfaces 59a coplanar (i.e., aligned along the X-axis) with the top surface 52a, and extend in depth (along the Z-axis) within the respective implanted regions 59' for a depth comprised between one nanometer and some tens of nanometers (e.g., between 1 and 20 nm) measured from the top surface 52a. Furthermore, the ohmic contacts 59" are not in direct physical contact with the drift layer 52 and are physically and electrically separated from the latter through the respective implanted regions 59'. For example, as shown in FIG. 1, each ohmic contact 59" extends in the respective implanted region 59' so as to be surrounded, inferiorly and laterally, by the latter, while the respective surface 59a is in contact with the anode metallization 58. This prevents the anode metallization 58 from forming resistances with the drift layer 52 (instead of the Schottky diodes 62), and the current from flowing both in direct bias condition and in reverse bias condition.

Figure 2A:
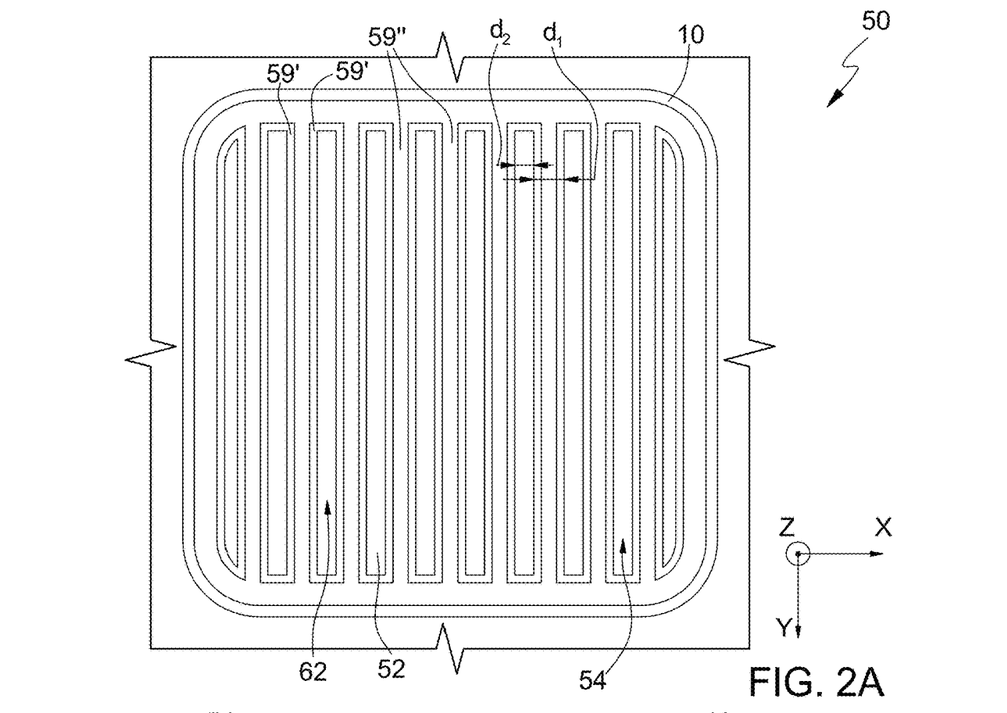
FIGS. 2A and 2B show, in plan view from above, the MPS device of FIG. 1, according to respective embodiments of the present disclosure.

FIG. 2A shows, in plan view from above in an XY-plane defined by the axes X and Y, the MPS device 50 according to an embodiment of the present disclosure, similar to that shown in FIG. 1.

In FIG. 2A, the MPS device 50 comprises a plurality of Schottky diodes 62 and JB elements 59 having respective shapes, in the XY-plane, similar to stripes. In particular, in the XY-plane the Schottky diodes 62 and the JB elements 59 have respective main extensions parallel to the Y-axis and are alternated to each other along the X-axis.

Figure 2B:
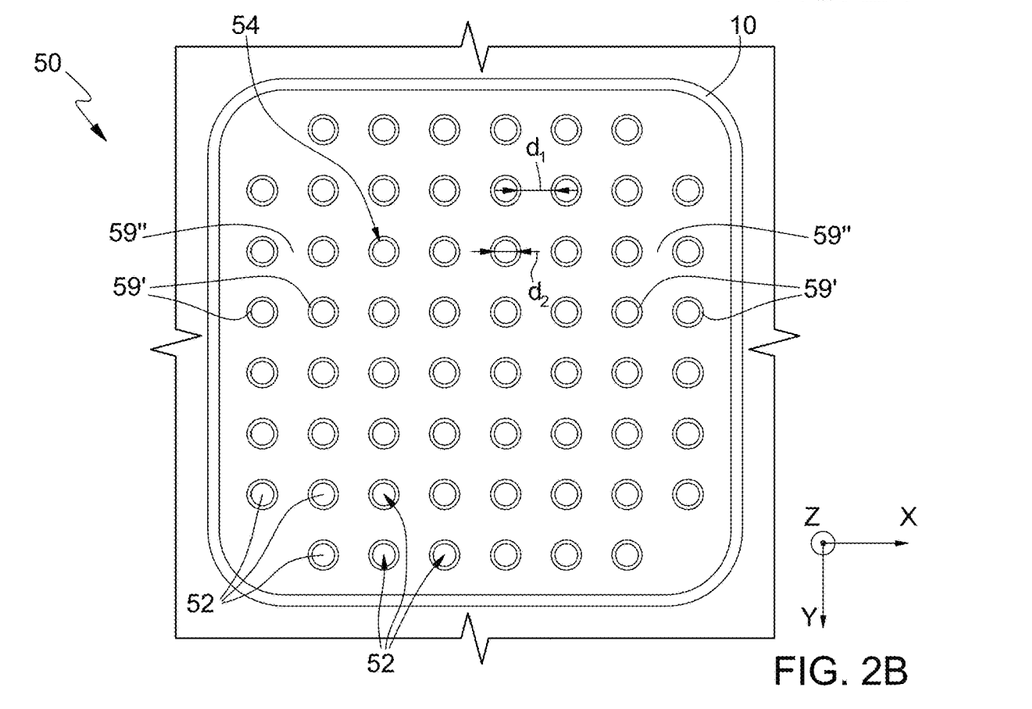

FIG. 2B shows, in plan view from above in the XY-plane, the MPS device 50 according to a further embodiment of the present disclosure, similar to that shown in FIG. 1.

In FIG. 2B, the MPS device 50 comprises a plurality of Schottky diodes 62 having respective structures, in the XY-plane, similar to cells arranged to form a matrix (or, alternatively, an array). In particular, in the XY-plane each Schottky diode 62 (i.e., each cell) has a circular shape. Alternatively, each Schottky diode 62 has, in the XY-plane, a polygonal shape, such as a square shape or a hexagonal shape. Furthermore, one or more JB elements 59 surround the Schottky diodes 62 such that the Schottky diodes 62 and the JB elements 59 are alternated to each other both parallel to the X-axis and parallel to the Y-axis.

As shown in FIGS. 1-2B, each JB element 59 has a width which is minimum parallel to the X-axis at the respective surface 59a, and equal to a first distance (or value) $d_1$, and each Schottky diode 62 has a respective width which is maximum parallel to the X-axis at the top surface 52a, and equal to a second distance (or value) $d_2$. Consequently, considering two Schottky diodes 62 close to each other (i.e., facing each other, parallel to the X-axis, through the same JB element 59), these two Schottky diodes 62 have a minimum reciprocal distance along the X-axis equal to the first distance $d_1$; and considering two JB elements 59 close to each other (i.e., facing each other, parallel to the X-axis, through the drift layer 52), these two JB elements 59 have a maximum reciprocal distance along the X-axis equal to the second distance $d_2$. In particular, in FIG. 2B, the second distance $d_2$ coincides with a diameter, in the XY-plane, of each Schottky diode 62 having said circular shape, and the first distance $d_1$ is the distance (measured parallel to the X-axis or the Y-axis) between Schottky diodes 62 close to each other in the cell matrix (i.e., immediately subsequent to each other in the cell matrix parallel to the X-axis or the Y-axis).

In more detail, each JB element 59 has a first and a second lateral surface 59b, 59c (FIG. 1) opposite to each other parallel to the X-axis and adjacent to the surface 59a. The lateral surfaces 59b, 59c of the same JB element 59 are distant from each other by the first distance $d_1$. Two JB elements 59 close to each other have the respective first lateral surfaces 59b (or, alternatively, the respective second lateral surfaces 59c) facing each other and which are distant from each other, at the anode metallization 58, by the second distance $d_2$.

According to the present disclosure, the first distance $d_1$ is greater than, or equal to, the second distance $d_2$. For example, the first distance $d_1$ is comprised between approximately 2 μm and approximately 3 μm, and the second distance $d_2$ is comprised between approximately 1.5 μm and approximately 1.8 μm.

Consequently, at the top surface 52a, an overall extension area of the Schottky diodes 62 is smaller than or equal to an overall extension area of the JB elements 59.

Furthermore, said second dopant concentration of the drift layer 52 is greater than the dopant concentration commonly used in the drift layer of the known MPS devices.

According to the present disclosure, the second dopant concentration is such that a breakdown voltage of the MPS device 50 is greater than, or equal to, 115% of a maximum working voltage of the MPS device 50 in an inhibition state (i.e., in reverse bias). In other words, the second dopant concentration is such that the breakdown voltage (i.e., the voltage, applicable to the MPS device 50 in an inhibition state, beyond which a charge carrier multiplication phenomenon occurs with consequent sharp increase, in absolute value, in the current of the device MPS 50) exceeds said maximum working voltage in inhibition state by, at most, 15% of the latter. In particular, the maximum working voltage is equal to a repetitive peak reverse voltage ($V_{RRM}$) of the MPS device 50, per se know.

Figure 2C:
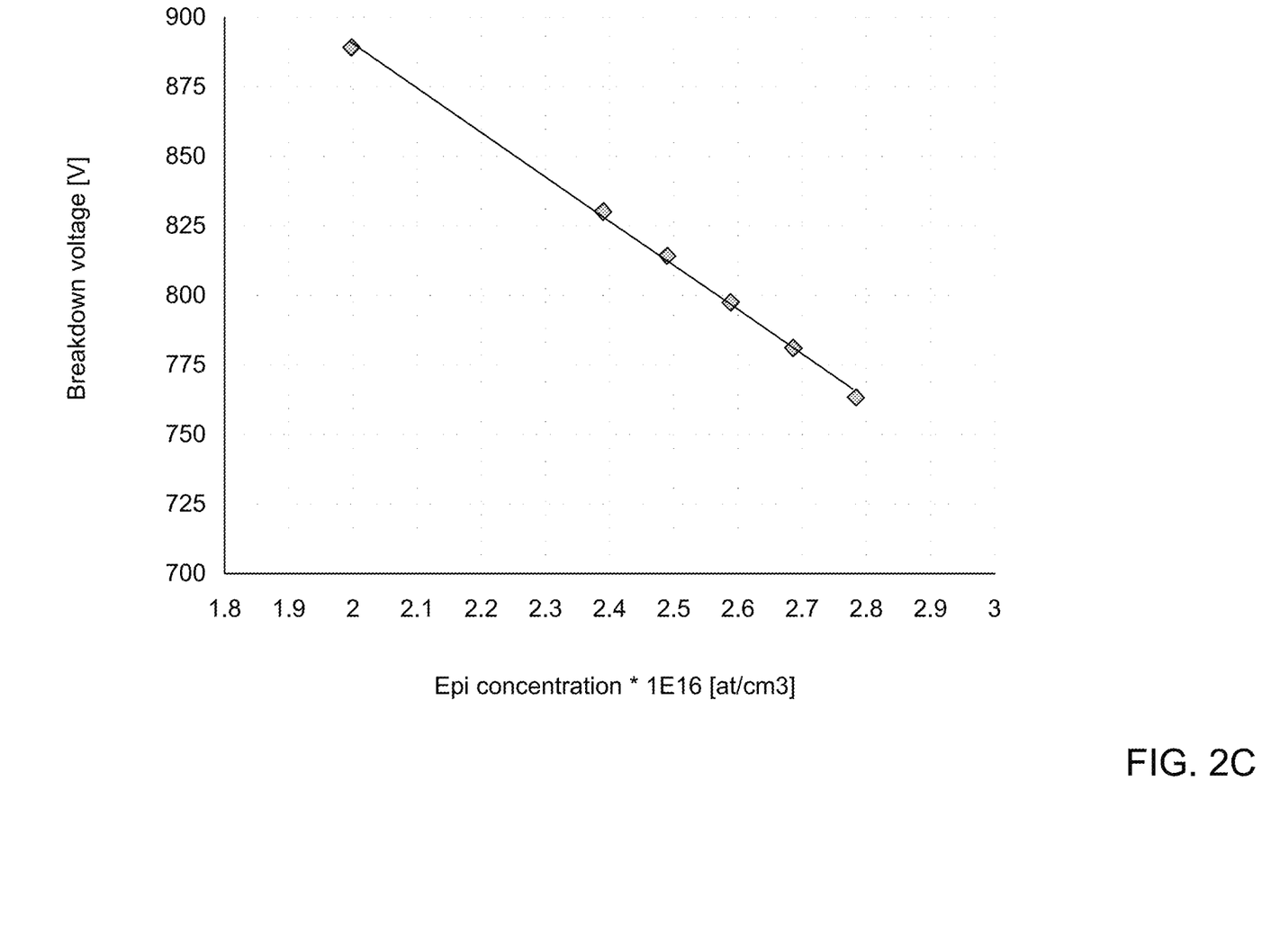
FIG. 2C is a diagram schematically illustrating the dependence of a breakdown voltage of the MPS device of FIG. 1 on a dopant concentration of a drift layer of said MPS device, according to an embodiment of the present disclosure.

In more detail, as shown in FIG. 2C, the breakdown voltage is inversely proportional (in detail, in a linear manner) to the second dopant concentration. For example, when the second dopant concentration is equal to approximately $2.8 \cdot e^{16}$ at/cm$^3$, the breakdown voltage is equal to approximately 760 V; and when the second dopant concentration is equal to approximately $2 \cdot e^{16}$ at/cm$^3$, the breakdown voltage is equal to approximately 880 V.

According to one embodiment, when the maximum working voltage of the MPS device 50 in the inhibition state is to be equal to approximately 650 V and said thickness of the drift layer 52 is equal to approximately 5 μm, the second dopant concentration varies between approximately $2 \cdot e^{16}$ at/cm$^3$ and approximately $2.8 \cdot e^{16}$ at/cm$^3$ to ensure that the breakdown voltage of the MPS device 50 is greater than, or equal to, approximately 750 V.

According to a further embodiment, when the maximum working voltage of the MPS device 50 in an inhibition state is to be equal to approximately 1200 V and said thickness of the drift layer 52 is equal to approximately 9 μm, the second dopant concentration is smaller than, or equal to, approximately $1.2 \cdot e^{16}$ at/cm$^3$ (e.g., it varies between approximately $5 \cdot e^{15}$ at/cm$^3$ and approximately $1.2 \cdot e^{16}$ at/cm$^3$) to ensure that the breakdown voltage of the MPS device 50 is greater than, or equal to, approximately 1380 V.

The manufacturing steps of the MPS device 50 are described herein below, with reference to FIGS. 3A-3G.

Figure 3A:
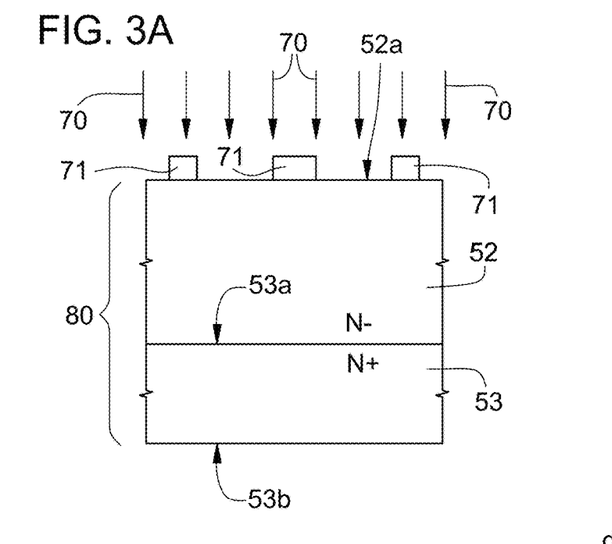
FIGS. 3A-3G show, in cross-sectional view, respective manufacturing steps of the MPS device of FIG. 1, according to an embodiment of the present disclosure.

With reference to FIG. 3A, a wafer 80, including the substrate 53 of SiC (in particular 4H—SiC, although other polytypes such as, but not limited to, 2H—SiC, 3C—SiC and 6H—SiC, may be used), is arranged. For example, the substrate 53 has a N-type dopant concentration comprised between $1 \cdot 10^{19}$ at/cm$^3$ and $1 \cdot 10^{22}$ at/cm$^3$, and has a thickness, measured along the Z-axis between the surfaces 53a and 53b, comprised between 300 μm and 450 μm, and in particular equal to approximately 360 μm.

The drift layer 52 is formed, on the surface 53a of the substrate 53, for example through epitaxial growth, having a N-type dopant concentration such that the breakdown voltage of the MPS device 50 is greater than, or equal to, 115% of the maximum working voltage in inhibition state of the MPS device 50, as previously described. The drift layer 52 is of SiC, in particular 4H—SiC, but other SiC polytypes, such as 2H, 6H, 3C or 15R, may be used.

A hard mask 71 is formed, on the surface 52a of the drift layer 52, for example through deposition of a photoresist, or TEOS, or another material suitable for the purpose. The hard mask 71 has a thickness between 0.5 μm and 2 μm or, in any case, a thickness such as to shield the implant described herein below with reference to FIG. 3B. The hard mask 71 extends in a region of the wafer 80 wherein, in subsequent steps, the active area 54 of the MPS device 50 will be formed. In plan view, on the XY-plane, the hard mask 70 covers regions of the surface 52a of the drift layer 52 which will form Schottky diodes 62 and leaves exposed regions of the surface 52a of the drift layer 52 which will form the implanted regions 59'.

Then, a step of implanting doping species (e.g., boron or aluminum), which have the second type of conductivity (here, P), is carried out, exploiting the hard mask 71 (the implant is indicated in the figure by arrows 70). During the step of FIG. 3A, the protection ring 60, if any, is also formed.

In an exemplary embodiment, the implanting step 70 comprises one or more implants of P-type doping species, with implant energy comprised between 30 keV and 400 keV and with doses between $1 \cdot 10^{12}$ at/cm$^2$ and $1 \cdot 10^{15}$ at/cm$^2$, to form the implanted regions 59' with a dopant concentration greater than $1 \cdot 10^{18}$ at/cm$^3$. Thus, implanted regions having depth, measured from the surface 52a, comprised between 0.4 μm and 1 μm, are formed.

Figure 3B:
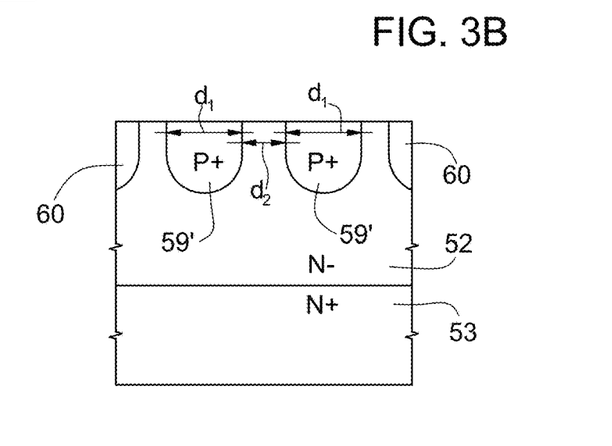

The implanted regions 59' and the protection ring 60 are shown in FIG. 3B, wherein the hard mask 71 is removed. In particular, FIG. 3B shows that the first distance $d_1$ is greater than the second distance $d_2$. Alternatively, the first distance $d_1$ is equal to the second distance $d_2$.

In FIG. 3B, a thermal annealing step is carried out at the surface 52a for the activation of the doping species implanted in the step of FIG. 3A. The thermal annealing is, for example, carried out at a temperature higher than 1500° C. (e.g., between 1700° C. and 1900° C.).

Figure 3C:
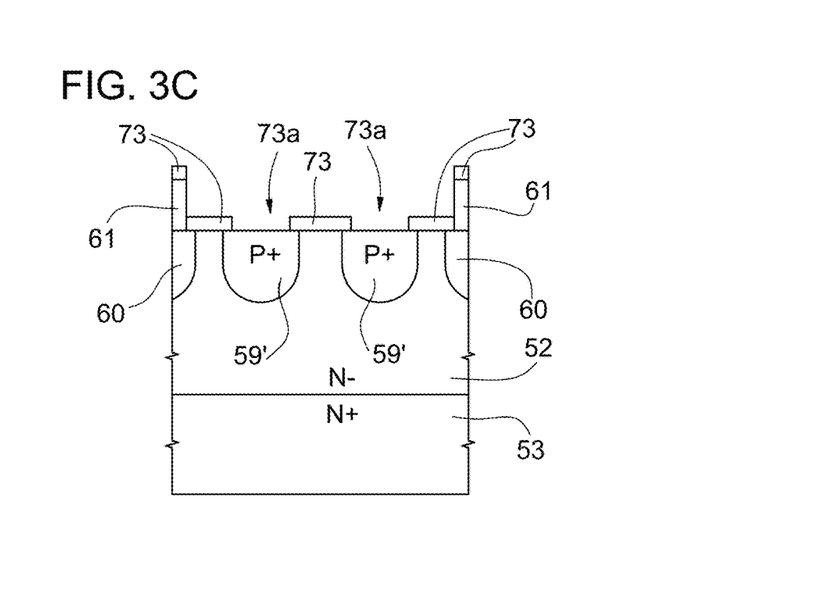
Figure 3D:
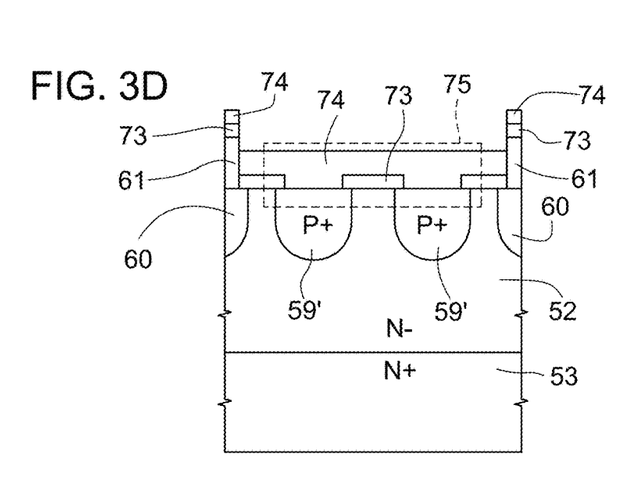
Figure 3E:
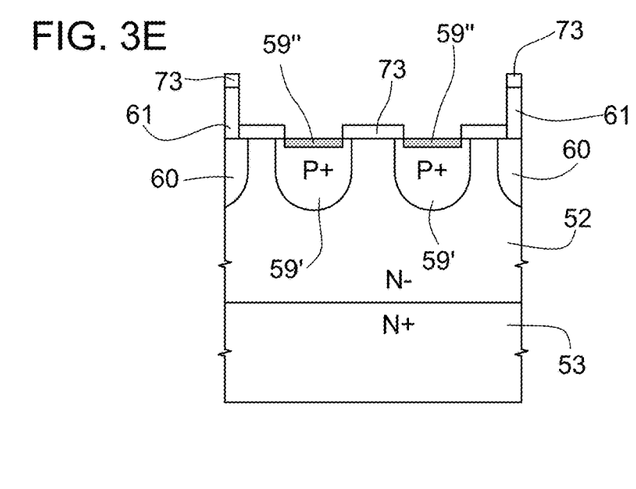

With reference to FIGS. 3C-3E, further steps are then carried out for the formation of the ohmic contacts 59".

With reference to FIG. 3C, the insulating layer 61, if any, is formed. The insulating layer 61 is, at least partially, superimposed to the protection ring 60 and defines with the latter the active area 54 of the MPS device 50.

Furthermore, with reference to FIG. 3C, a deposition mask 73 of silicon oxide or TEOS is formed to cover surface regions of the drift layer 52 different from the implanted regions 59' (and of the protection ring 60, if any). In other words, the mask 73 has through openings 73a at portions of the implanted regions 59', which will become the ohmic contacts 59".

Then, FIG. 3D, a nickel deposition is carried out on the mask 73 and within the through openings 73a (metal layer 74 in FIG. 3D). The nickel thus deposited reaches and contacts the implanted regions 59' through the through openings 73a.

With reference to FIG. 3E, a subsequent high temperature thermal annealing (between 900° ° C. and 1200° ° C. for a time interval from 1 minute to 120 minutes), allows the ohmic contacts 59" of nickel silicide to be formed, by chemical reaction, between the deposited nickel and the silicon of the drift layer 52 at the through openings 73a. In fact, the deposited nickel reacts where it is in contact with the surface material of the drift layer 52, forming $Ni_2Si$ (i.e., the ohmic contact 59"). Subsequently, a step of removing the metal layer 74, which extends above the mask 73 and the ohmic contacts 59", is carried out.

Figure 3F:
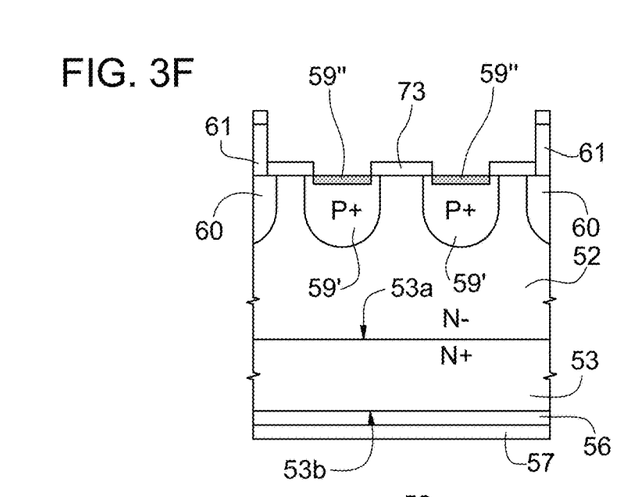

With reference to FIG. 3F, a step of grinding the substrate 53 is carried out at the surface 53b, so as to reduce the thickness of the substrate 53. For example, at the end of the grinding step the substrate 53 has thickness, measured along the Z-axis between the surfaces 53a and 53b, comprised between 100 µm and 250 µm, and in particular equal to approximately 180 µm. The ohmic contact layer 56 from the surface 53b of the substrate 53 (process similar to what described with reference to FIGS. 3C-3E), and the cathode metallization 57 from the ohmic contact layer 56 are then formed in succession to each other.

Figure 3G:
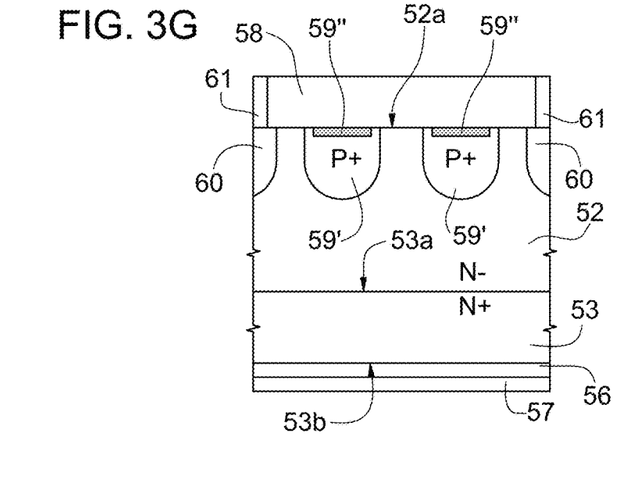

With reference to FIG. 3G, a step of removing the mask 73 is carried out. Furthermore, the anode metallization 58 is formed on the ohmic contacts 59" and on the regions previously covered by the mask 73. For example, Ti/AlSiCu or Ni/AlSiCu are deposited on the surface 52a of the drift layer 52 such that the anode metallization 58 contacts the drift layer 52 and the JB elements 59.

Then, the passivation layer 69 (not shown in FIG. 3G) is formed on the anode metallization 58 and on the insulating layer 61, obtaining the MPS device 50 shown in FIG. 1.

From a discussion of the features of the disclosure provided according to the present description, the advantages that it achieves are apparent.

In particular, since in the MPS device 50 the first distance $d_1$ is greater than, or equal to, the second distance $d_2$, the MPS device 50 is less subject to the lithographic limitations of the known MPS devices related to the formation of the ohmic contacts 59", and therefore it is more scalable. Consequently, the MPS device 50 allows an optimal use of the wafer area (ensuring a higher integration density), and allows a reduction of manufacturing costs and improved electrical performance.

Furthermore, the high doping species concentration of the drift layer 52 allows a high on-state current flow (i.e., a high surge peak forward current, IFSM, parameter) and prevents the higher ratio between the JB elements 59 and Schottky diodes 62 in the area from leading to degraded electrical performance.

In more detail, the only parameter affecting the design and calculation of the second dopant concentration is the desired breakdown voltage of the MPS device 50. The MPS device 50 has therefore less stringent design limits with respect to the known MPS devices, wherein the dopant concentration of the drift layer affects both the breakdown voltage and, above all, the current leakages.

The MPS device 50 allows reduced current leakages due to a higher pinching efficiency operated by the JB elements 59 on the Schottky diodes 62. In fact, since the first distance $d_1$ is greater than, or equal to, the second distance $d_2$, in use the voltage drops are mainly borne by the JB elements 59 and, therefore, there is a reduced electrical field at the surface 52a of the drift layer 52 and, in particular, at the Schottky diodes 62.

Finally, it is clear that modifications and variations may be made to what has been described and illustrated herein, without thereby departing from the scope of protection of the present disclosure, as defined in the attached claims.

A Merged-PiN-Schottky, MPS, device (50) may be summarized as including a substrate (53) of silicon carbide having a first conductivity; a drift layer (52) of silicon carbide having the first conductivity, extending on the substrate (53); a first implanted region (59') having a second conductivity opposite to the first conductivity and extending in the drift layer (52), at a top surface (52a) of the drift layer (52), so as to form a first junction-barrier, JB, diode (59) with the substrate (53); and—a first electrical terminal (58) in ohmic contact with a first surface (59a) of the first implanted region (59'), coplanar with the top surface (52a) of the drift layer (52), and also in direct electrical contact with the top surface (52a) of the drift layer (52) laterally to the first implanted region (59'), so to form a first Schottky diode (62) with the drift layer (52), wherein the first JB diode (59) and the first Schottky diode (62) are alternated to each other, at the first electrical terminal (58), along a first axis (X) so that the first JB diode (59) has, at the first surface (59a) of the first implanted region (59'), a width which is minimum parallel to the first axis (X) and has a first value ($d_1$), and the first Schottky diode (62) has, at the top surface (52a) of the drift layer (52), a respective width which is maximum parallel to the first axis (X) and has a second value ($d_2$) smaller than, or equal to, the first value (d1), and wherein the drift layer (52) has an own dopant concentration such that a breakdown voltage of the MPS device, beyond which a charge carrier multiplication phenomenon occurs, is greater than, or equal to, 115% of a maximum working voltage of the MPS device in an inhibition state.

The first implanted region (59') may have a first lateral surface (59b) and a second lateral surface (59c) opposite to each other parallel to the first axis (X) and adjacent to the first surface (59a) of the first implanted region (59'), and wherein the first (59b) and the second (59c) lateral surfaces are distant from each other, at the first electrical terminal (58) and parallel to the first axis (X), by the first value ($d_1$).

The device may include a second implanted region (59') having the second conductivity and extending in the drift layer (52), at the top surface (52a) of the drift layer (52), so to form a second JB diode (59) with the substrate (53), the second implanted region (59') having a respective first surface (59a) in ohmic contact with the first electrical terminal (58), and having a respective first lateral surface (59b) and a respective second lateral surface (59c) opposite to each other parallel to the first axis (X) and adjacent to the first surface (59a) of the second implanted region (59'), the first Schottky diode (62) being arranged, at the top surface (52a) of the drift layer (52) and parallel to the first axis (X), between the first implanted region (59') and the second implanted region (59') so that the respective first lateral surfaces (59b) or, alternatively, the respective second lateral surfaces (59c) face each other through the drift layer (52) and are distant from each other, at the top surface (52a) of the drift layer (52), by the second value ($d_2$) parallel to the first axis (X).

The device may further include a first electrical contact region (59") extending in, or on, the first implanted region (59') at the respective first surface (59a), the first electrical contact region (59") forming an ohmic contact and being physically and electrically separated from the drift layer (52) through the first implanted region (59').

The dopant concentration of the drift layer (52) may be smaller than, or equal to, $2.8 \cdot e^{16}$ at/cm$^3$ for the maximum working voltage equal to 650 V.

The dopant concentration of the drift layer (52) may be smaller than, or equal to, $1.2 \cdot e^{16}$ at/cm$^3$ for the maximum working voltage equal to 1200 V.

The device may further include a second electrical contact region (56) at a back side (53b) of the substrate (53), opposite to the drift layer (52); a second electrical terminal (57) at the second electrical contact region (56); and a passivation layer (69) extending on the first electrical terminal (58).

The device may include at least one second Schottky diode (62) and at least one third implanted region (59') forming a respective third JB diode (59), wherein the Schottky diodes (62) and the JB diodes (59) are alternated to each other along the first axis (X) to form a diode array or, alternatively, are alternated to each other along the first axis (X) and along a second axis (Y) orthogonal to the first axis (X) to form a diode matrix.

A method for manufacturing a Merged-PiN-Schottky, MPS, device (50) may be summarized as including the steps of: arranging a substrate (53) of silicon carbide having a first conductivity; forming, on the substrate (53), a drift layer (52) of silicon carbide having the first conductivity; forming, in the drift layer (52) and at a top surface (52a) of the drift layer (52), a first implanted region (59') having a second conductivity opposite to the first conductivity, so as to form a first junction-barrier, JB, diode (59) with the substrate (53); and forming a first electrical terminal (58) in ohmic contact with a first surface (59a) of the first implanted region (59'), coplanar with the top surface (52a) of the drift layer (52), and also in direct electrical contact with the top surface (52a) of the drift layer (52) laterally to the first implanted region (59'), so to form a first Schottky diode (62) with the drift layer (52), the first JB diode (59) and the first Schottky diode (62) being alternated to each other, at the first electrical terminal (58), along a first axis (X) so that the first JB diode (59) has, at the first surface (59a) of the first implanted region (59'), a width which is minimum parallel to the first axis (X) and has a first value ($d_1$), and the first Schottky diode (62) has, at the top surface (52a) of the drift layer (52), a respective width which is maximum parallel to the first axis (X) and has a second value ($d_2$) smaller than, or equal to, the first value ($d_1$), and the drift layer (52) having an own dopant concentration such that a breakdown voltage of the MPS device, beyond which a charge carrier multiplication phenomenon occurs, is greater than, or equal to, 115% of a maximum working voltage of the MPS device in an inhibition state.

An electronic apparatus may be summarized as including a Merged-PiN-Schottky, MPS, device (50).

For example, the conductivities described with reference to FIG. 1 may be inverted to each other with respect to what previously described. In this case, therefore, the drift layer 52 and the substrate 53 are of P-type, and the implanted regions 59' and, if any, the protection ring 60 are of N-type.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a substrate of silicon carbide;
   a drift layer of silicon carbide on the substrate;
   a first implanted region in the drift layer, the first implanted region having a first dimension in a first direction;
   a second implanted region in the drift layer, the second implanted region having a second dimension in the first direction, the second implanted region being spaced from the first implanted region by a third dimension in the first direction, the third dimension being less than both the first and the second dimension;
   a first ohmic contact in the first implanted region;
   a second ohmic contact in the second implanted region;
   a first junction-barrier (JB) diode at a first surface of the drift layer and the first implanted region;
   a second junction-barrier (JB) diode at the first surface of the drift layer and the second implanted region; and
   a first electrical terminal in ohmic contact with the first surface of the drift layer at the first implanted region and the second implanted region
   a first Schottky diode at the drift layer between the first and second implanted regions.

2. The device of claim 1 wherein the first ohmic contact has a fourth dimension in the first direction, the fourth dimension being less than the first dimension.

3. The device of claim 2 wherein the second ohmic contact has a fifth dimension in the first direction, the fifth dimension being less than the second dimension.

4. The device of claim 3 wherein the first electrical terminal having a sixth dimension in the first direction that is greater than a sum of the first, second, and third dimensions.

5. The device of claim 4 wherein the drift layer has a dopant concentration such that a breakdown voltage, beyond which a charge carrier multiplication phenomenon occurs, is greater than, or equal to, 115% of a maximum working voltage of the device in an inhibition state.

6. A device, comprising:
   a drift layer of a first conductivity type, the drift layer having a first surface;

a first implanted region of a second conductivity type extending in the drift layer from the first surface, the first implanted region having a first dimension in a first direction;

a second implanted region of the second conductivity type extending into the drift layer from the first surface, the second implanted region having a second dimension in the first direction, the second implanted region being spaced from the first implanted region by a third dimension in the first direction, the third dimension being less than the second dimension, the third dimension being less than the first dimension;

a first terminal on the first surface of the drift layer;

a first Schottky diode between the first terminal and the drift layer between the first and second implanted regions.

7. The device of claim 6, comprising a first junction barrier diode between the first implanted region and the first terminal and a second junction barrier diode between the second implanted region and the first terminal.

8. The device of claim 7 wherein first terminal being on the first and second implanted regions, the first terminal having a fourth dimension in the first direction, the fourth dimension being greater than a sum of the first, second, and third dimensions.

9. The device of claim 8, comprising a protection ring in the drift layer and surrounding the first and second implanted regions.

10. The device of claim 9 wherein a first end of the first terminal overlaps a portion of the protection ring adjacent to the first implanted region and a second end of the first terminal overlaps a portion of the protection ring adjacent to the second implanted region.

11. A device, comprising:
a substrate;
a drift layer of silicon carbide on the substrate;
a first implanted region in the drift layer, the first implanted region having a first dimension in a first direction;
a second implanted region in the drift layer, the second implanted region having a second dimension in the first direction, the second implanted region being spaced from the first implanted region by a third dimension in the first direction, the third dimension being less than both the first and the second dimension;
a first ohmic contact in the first implanted region;
a second ohmic contact in the second implanted region.

12. The device of claim 11, comprising a first junction-barrier (JB) diode at a first surface of the drift layer and the first implanted region and a second junction-barrier (JB) diode at the first surface of the drift layer and the second implanted region.

13. The device of claim 12 comprising a first electrical terminal in ohmic contact with the first surface of the drift layer at the first implanted region and the second implanted region.

14. The device of claim 13, comprising a first Schottky diode at the drift layer between the first and second implanted regions.

15. The device of claim 14 wherein the substrate is silicon carbide and has a first conductivity type, the drift layer having the first conductivity type, and the first and second implanted regions having a second conductivity type.

16. The device of claim 15 wherein the first ohmic contact has a fourth dimension in the first direction, the fourth dimension being less than the first dimension.

17. The device of claim 16 wherein the second ohmic contact has a fifth dimension in the first direction, the fifth dimension being less than the second dimension.

18. The device of claim 17 wherein the first electrical terminal having a sixth dimension in the first direction that is greater than a sum of the first, second, and third dimensions.

* * * * *